United States Patent [19]

Fujino et al.

[11] Patent Number: 4,835,705
[45] Date of Patent: May 30, 1989

[54] INTERCONNECTION AREA DECISION PROCESSOR

[75] Inventors: Yasuhiro Fujino; Masayuki Terai; Tomoyoshi Noda; Yoshihide Ajioka, all of Hyogo, Japan

[73] Assignee: Mitsubishi Denki Kabushiki Kaisha, Tokyo, Japan

[21] Appl. No.: 14,374

[22] Filed: Feb. 10, 1987

[30] Foreign Application Priority Data

Feb. 17, 1986 [JP] Japan .................................. 61-32242

[51] Int. Cl.$^4$ .............................................. G06F 15/60
[52] U.S. Cl. .................................... 364/491; 364/490; 364/489; 364/488
[58] Field of Search ................. 364/488, 489, 490, 491

[56] References Cited

U.S. PATENT DOCUMENTS 4,577,276  3/1986  Dunlop et al. ....................... 364/490
4,613,941  9/1986  Smith et al. ......................... 364/490

FOREIGN PATENT DOCUMENTS 0107178  6/1985  Japan .................................. 364/491

OTHER PUBLICATIONS

"Automatic Placement and Routing of Gate Arrays", by Gary Robson, VLSI Design, Apr. 1984, pp. 35–43.
"An Over–Cell Gate Array Channel Router", by Howard E. Krohn, IEEE 20th Design Automation Conference, 1983, pp. 665–670.
"A Routing Program Applicable to Various Chip Structure of Gate Arrays", by Masaynki Terai et al., Joho Shori Gakkai, Ronbunshi, vol. 25, No. 3, May 1984, pp. 357–364.
Mayayuki Terai, Tomoyoshi Noda, Koji Sato and Toshihiko Yahara, "A Routing Program Applicable to Various Chip Structures of Gate Arrays", Johoshori Gakki Ronbunshi, vol. 25, No. 3 (1984).

Primary Examiner—Parshotam S. Lall
Assistant Examiner—V. N. Trans
Attorney, Agent, or Firm—Lowe, Price, LeBlanc, Becker & Shur

[57] ABSTRACT

The present invention provides an interconnection area decision processor for deciding vertical widths of areas employed for interconnection of a gate array. The interconnection area decision processor predicts which interconnection area each signal net passes on the basis of previously created data on cell arrangement and data on arrangement of transistor rows on a chip to estimate interconnection congestion per channel on the basis of the result of prediction and decide the number of transistor rows to be assigned to each channel on the basis of the estimated interconnection congestion, thereby to create data on the vertical width of each channel. Thus, density of integration can be improved by increasing the number of tracks of channels having large numbers of interconnections and decreasing the number of tracks of channels having small numbers of interconnections.

7 Claims, 5 Drawing Sheets

PRIOR ART

FIG.1

| CHANNEL NO. | TRACK NO. |
|---|---|
| 1 | t1 |
| 2 | t2 |
| 3 | t3 |
| ⋮ | ⋮ |
| n | tn |

PRIOR ART

FIG.2

| CELL NO. | TERMINAL NO. | SIGNAL NET IDENTIFIER | POSITION |
|---|---|---|---|
| G1 | P1 | S1 | L1 |
| G1 | P2 | S2 | L1 |
| G2 | P3 | S1 | L2 |
| G2 | P4 | S3 | L2 |
| G3 | P5 | S2 | L3 |
| G3 | P6 | S2 | L3 |
| G3 | P7 | S1 | L3 |
| G4 | P8 | S4 | L4 |
| G4 | P9 | S1 | L4 |

| TRANSISTOR TRAIN NO. | TRANSISTOR TYPE |
|---|---|
| 1 | n |
| 2 | p |
| 3 | n |
| 4 | p |
| 5 | n |
| 6 | p |
| 7 | n |
| 8 | p |
| 9 | n |
| 10 | p |
| 11 | n |
| 12 | p |
| 13 | n |
| 14 | p |

INTERCONNECTION AREA DECISION PROCESSOR

BACKGROUND OF THE INVENTION

1. Field of the Invention

The present invention relates to an interconnection area decision processor. More specifically, it relates to an interconnection area decision processor which decides vertical widths of interconnection areas in a gate array where rows of transistors are arranged with minimal spaces and any portion of the LSI chip can be used for constructing logic elements with the remaining areas being used for interconnections.

2. Description of the Prior Art

FIG. 1 illustrates data on channel vertical widths to which the present invention is applied and which are processed by a conventional automatic interconnection processor, FIG. 2 illustrates data on arrangement of cells, FIG. 3 shows exemplary LSI chip structure processed by the conventional automatic interconnection processor, FIG. 4 shows an example of channel interconnection and FIG. 5 schematically shows the structure of the conventional automatic interconnection processor.

With reference to FIGS. 1 to 5, description is now made on a conventional automatic routing method. Referring to FIG. 3, cells 31 each forming the element in logic design and layout design with a certain logical function are arranged in horizontal rows on a large-scale integrated circuit chip. Input/output buffer cells 32 are arranged around the cells 31 and interconnection areas (hereinafter referred to as channels) 33 are defined between adjacent rows of the cells 31. The channels 33 are identical in horizontal width to each other except for vertical channels, while the same may be different in vertical width from each other. The horizontal and vertical widths of each channel 33 are decided by hand without consideration of the degree of interconnection congestion in advance to automatic placement/routing.

In general, the cells 31 and the input/output buffer cells 32 are automatically interconnected in the following manner: First loose interconnection paths through the channels 33 are decided. Then the respective channels 33 are entirely interconnected along certain sequence. Detailed interconnection paths within the respective channels 33 are decided per channel, thereby to complete the entire interconnection.

FIG. 4 shows an example of interconnection with respect to a single channel 33, while this figure may be rotated by 90° with respect to a vertical channel. Cell terminals 33a for fixing positions are disposed on upper and lower edges of the channel 33, while left and right edges thereof, which are generally bounded by other channels 33, are provided with terminals 33b whose positions are not decided. A set of the terminals 33a and 33b to be equipotentially connected is called as a signal net. In the channel 33, two layers which are isolated through an interlayer insulating film are available for interconnection, that is, the first layer is used for a horizontal interconnection segment 33c and the second layer is used for a vertical interconnection segment 33f. The interconnection segments on the different layers in the same signal net are connected by a via hole 33d provided in the interlayer insulating film. The horizontal interconnection segment 33c is placed on a horizontal interconnection grid line 33e called a track and the vertical interconnection segment 33f is placed on a vertical interconnection grid line (not shown).

With reference to FIG. 5, description is now made on the conventional automatic interconnection processor. A memory device 11 stores data on cell arrangement as shown in FIG. 2, while another memory device 14 stores data (the number of tracks) on the vertical widths of respective channels as shown in FIG. 1. A computer 15 performs interconnection processing on the basis of the data on cell arrangement and the data on the vertical widths of the respective channels stored in the memory devices 11 and 14 respectively. A memory device 16 stores data indicating the result of interconnection processed by the computer 15.

In the conventional routing method as hereinabove described, the number of tracks of the channels are previously decided by hand and cannot be decided according to the degree of interconnection congestion of each channel. Thus, increase in circuit scale easily leads to unroutable signal net caused by interconnection congestion, while the density of integration of the elements cannot be improved since the vertical width of a channel cannot be adjusted according to interconnection congestion.

SUMMARY OF THE INVENTION

Accordingly, the principal object of the present invention is to provide an interconnection area decision processor which can effectively decide the vertical widths of channels to reduce interconnection disability, thereby to improve the density of integration of the elements.

Briefly stated, the interconnection area decision processor according to the present invention is adapted to previously stored data on cell arrangement and data on arrangement of transistor rows on a chip to predict which channel each signal net passes and calculate the number of schematic interconnections per channel on the basis of the result of prediction and decide the number of rows of transistors to be assigned to each channel through the number of the calculated schematic interconnections, thereby to create data on the vertical width of each channel.

According to the present invention, therefore, the vertical width of each channel can be optimumly decided in advance to actual interconnection by predicting which channel each signal net passes and estimating interconnection congestion of each channel, thereby to prevent interconnection disability and improve the density of integration of the elements.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 illustrates data on the widths of channels to which the present invention is applied and which are processed by a conventional automatic interconnection processor.

FIG. 2 illustrates data on arrangement of cells.

DESCRIPTION OF THE PREFERRED EMBODIMENT

Figure 6:
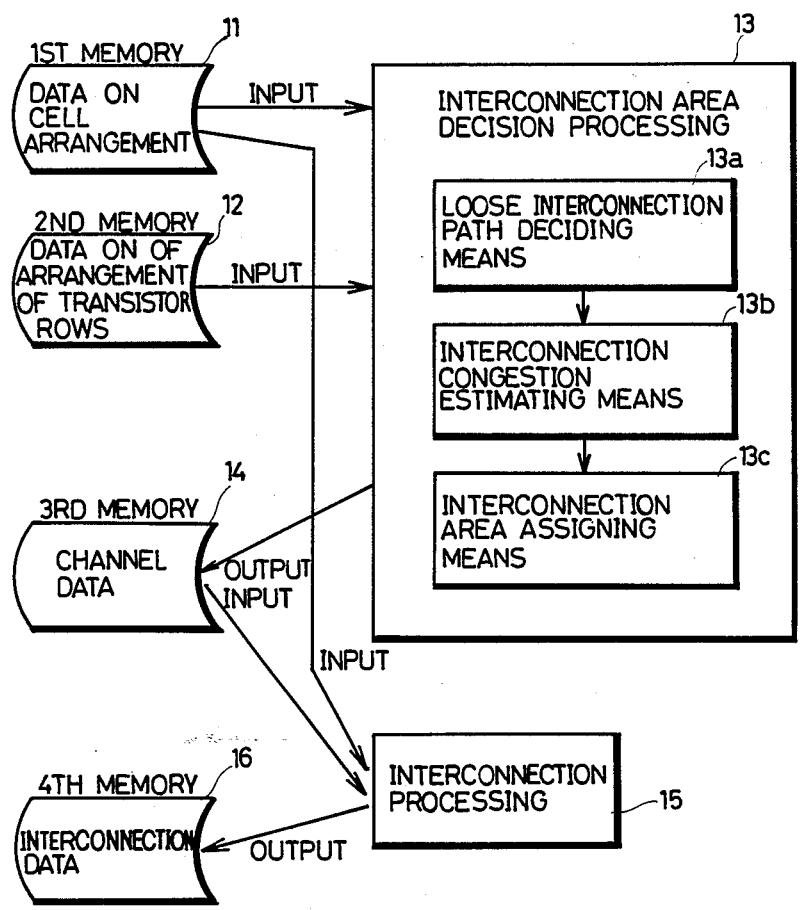
FIG. 6 is a schematic block diagram showing an embodiment of the present invention.
Figures 8, 9:
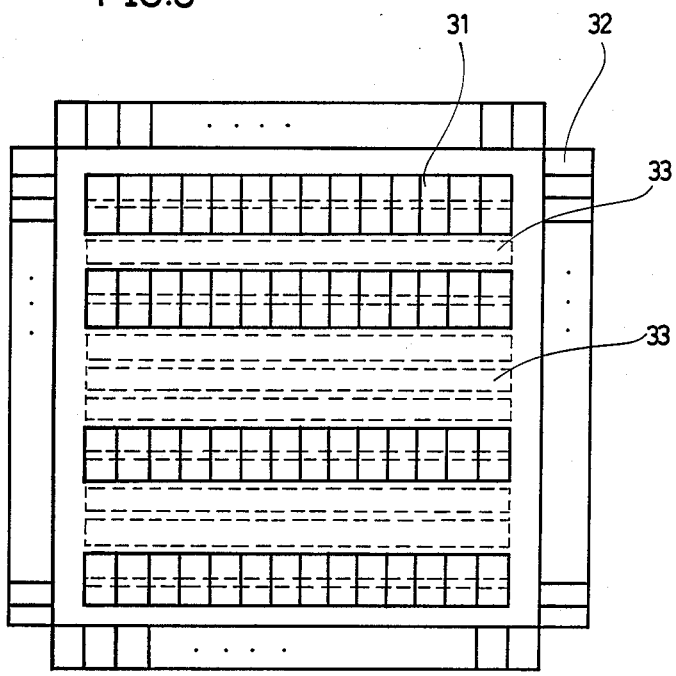
FIG. 9 shows an example of transistor row data.

FIG. 6 is a schematic block diagram showing an embodiment of the present invention. With reference to FIG. 6, description is now made on the structure of this embodiment. An interconnection area decision processor 13 is connected with first, second and third memory devices 11, 12 and 14. The first memory device 11 is adapted to store previously created data on cell arrangement as shown in FIG. 2. The second memory device 12 is adapted to store data on arrangement of transistor rows on a chip as shown in FIG. 9 as hereinafter described. The third memory device 14 is adapted to store data (the number of tracks) on the vertical width of each channel as shown in FIG. 1. Further provided are an interconnection processing computer 15 and a fourth memory device 16. The interconnection processing computer 15 is adapted to perform arithmetic for interconnection processing on the basis of the cell arrangement data stored in the first memory device 11 and the channel data stored in the third memory device 14. The fourth memory device 16 is adapted to store the result of interconnection operated by the interconnection processing computer 15.

The interconnection area decision processor 13 includes a loose interconnection path calculating means 13a, interconnection congestion estimating means 13b and an interconnection area assigning means 13c. The loose interconnection path deciding means 13a is adapted to predict which channel each signal net passes. The interconnection congestion estimating means 13b is adapted to predict a schematic interconnection number per channel on the basis of the loose interconnection path decided by the loose interconnection path deciding means 13a. The interconnection area assigning means 13c is adapted to decide the number of transistor rows to be assigned to each channel through the interconnection congestion estimated by the interconnection congestion estimating by the schematic interconnection number operating means 13b, to create data (the number of tracks) on the vertical width of each channel.

The interconnection area decision processor 13 receives the cell arrangement data stored in the first memory device 11 and the transistor row arrangement data stored in the second memory device 12, to output data on vertical widths of the channels. Upon decision of the interconnection areas by the interconnection area decision processor 13, the channel vertical width data stored in the third memory device 14 and the cell arrangement data stored in the first memory device 11 are supplied to the interconnection processing computer 15, which in turn executes arithmetic for interconnection processing. The fourth memory device 16 stores data on the result of interconnection by the interconnection processing computer 15.

Figure 3:
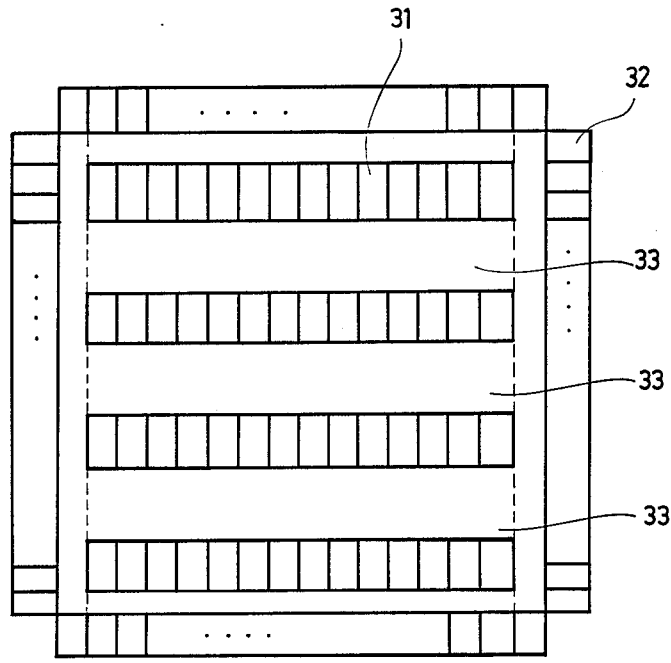
FIG. 3 shows exemplary LSI chip structure processed by the conventional automatic interconnection processor.
Figure 4:
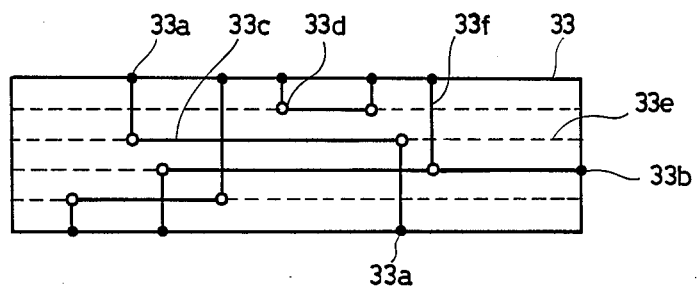
FIG. 4 shows an example of channel interconnection.
Figure 5:
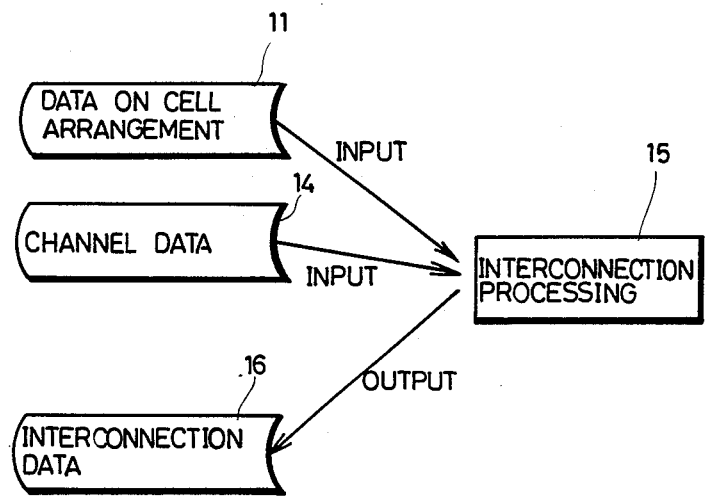
FIG. 5 schematically shows the structure of conventional automatic interconnection processor.
Figure 7:
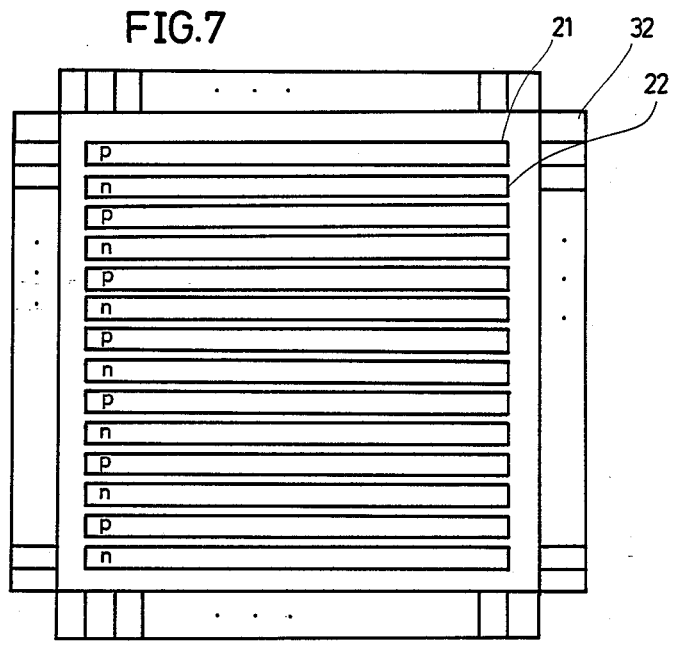
FIGS. 7 and 8 illustrate exemplary chip structure of a large-scale integrated circuit where rows of CMOS transistor pairs are arranged with minimal spaces.

FIGS. 7 and 8 illustrate exemplary chip structure of a CMOS large-scale integrated circuit whose interconnection areas are decided by the present invention, and FIG. 9 shows an example of transistor row data.

Referring to FIG. 7, horizontal rows 21 of p-type transistors and horizontal rows 22 of n-type transistors are arranged on an LSI chip with minimal spaces, and input/output buffer cells 32 are disposed around the same. Any portion of the LSI chip can be used for constructing logic elements with remaining areas being used for interconnections data. Data on arrangement of the transistors as shown in FIG. 7 are expressed as shown in FIG. 9, for example. Referring to FIG. 9, the transistor rows are numbered as 1, 2, 3, . . . successively from the bottom of the LSI chip. The interconnection area decision processor 13 as shown in FIG. 6 calculates the vertical widths (the number of tracks) of the channels, to output the channel vertical width data to the third memory device 14. FIG. 8 shows an example of an LSI chip whose channel widths are decided. Referring to FIG. 8, cells 31 may be formed by pairs of p-type and n-type transistors, p-n transistors or n-p transistors, whereby the channel vertical widths can be changed in the units of the vertical widths of the transistor rows.

Description is now made on definite operation of the embodiment. First, the loose interconnection path deciding means 13a of the interconnection area decision processor 13 predicts which channel each signal net passes on the assumption that the loose interconnection paths of any other signal net are not considered, on the basis of the previously created cell arrangement data stored in the first memory device 11 and the data on arrangement of the transistor rows on the chip stored in the second memory device 12.

Then, the interconnection congestion estimating means 13b estimate the interconnection congestion per channel on the basis of the loose interconnection path decided by the loose interconnection path deciding means 13a. On the basis of the interconnection congestion estimated by the interconnection congestion estimating means 13c, the interconnection area assigning means 13c assigns large numbers of transistor rows to channel where interconnection congestion occurs while assigning small numbers of transistor rows or no such transistor row to channels where interconnection congestion does not occur. Even if a channel includes no transistor row, transistor rows are arranged with minimal spaces, and hence the channel has several tracks. Thus, the vertical width (the number of tracks) of each channel is decided to be stored in the third memory device 14. The interconnection processing computer 15 performs arithmetic on interconnection data on the basis of the data on the vertical width of each channel stored in the third memory device 14 and the data on the cell arrangement stored in the first memory device 11, to make the fourth memory device 16 store the interconnection data.

Although the present invention has been applied to the CMOS gate array in the above description, the same is not restricted to the said structure but is applicable to the ECL gate array.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. For a large scale integrated circuit formed with rows of transistors horizontally disposed between left and right sides of a chip and wherein said rows are arranged throughout the chip between the upper and lower ends thereof so that transistors on said chip which are to be employed as cells can be arbitrarily selected and other transistors can be used as interconnection areas:

a method of determining vertical widths of channels between said rows during interconnection processing of a particular circuit arrangement on the chip, comprising the steps of storing first data defining a cell arrangement on the chip;

storing second data defining a transistor arrangement on the chip;

in response to said first and second data, predicting a loose interconnection path as to through which channel each signal net passes, wherein each said signal net is a set of cell terminals to be interconnected;

estimating interconnection congestion for each said channel on the basis of a thereby predicted loose interconnection path; and determining a number of said transistor rows to be assigned to each said channel on the basis of thereby estimated interconnection congestion to create data on the vertical width of each said channel.

2. The method of claim 1, wherein said step of determining includes arithmetically processing said cell arrangement data and said channel vertical width data for generating interconnection data.

3. For a large scale integrated circuit formed with rows of transistors horizontally disposed between left and right sides of a chip and wherein said rows are arranged throughout the chip between the upper and lower ends thereof so that transistors on said chip which are to be employed as cells can be arbitrarily selected and other transistors can be used as interconnection areas:

an interconnection area decision processor for determining vertical widths of channels between said rows during interconnection processing of a particular circuit arrangement on the chip, comprising first memory means for storing predetermined data defining a cell arrangement on the chip;

second memory means for storing data defining a transistor arrangement on the chip;

loose interconnection path decision means responsive to said data stored in said first and second memory means for predicting a loose interconnection path as to through which channel each signal net passes, wherein each said signal net is a set of cell terminals to be interconnected;

interconnection congestion estimating means for estimating interconnection congestion for each said channel on the basis of said loose interconnection path predicted by said loose interconnection path deciding means; and interconnection area assigning means for determining a number of said transistor rows to be assigned to each said channel on the basis of said interconnection congestion estimated by said interconnection congestion estimating means, to create data on the vertical width of each said channel.

4. The processor of claim 3, including third memory means for storing said channel vertical width data.

5. The processor of claim 3, wherein said interconnection congestion estimating means includes means for predicting a schematic interconnection number per channel; and said interconnection area assigning means includes means responsive to said schematic interconnection number for determining the number of transistor rows to be assigned to each said channel.

6. The processor of claim 3, including an interconnection processing computer responsive to said cell arrangement data stored in said first memory means and said channel vertical width data stored in said third memory means for generating interconnection data.

7. The processor of claim 6, including fourth memory means for storing said interconnection data.

* * * * *